(12) United States Patent
Iguchi et al.

(10) Patent No.: US 8,258,061 B2
(45) Date of Patent: Sep. 4, 2012

(54) MANUFACTURING METHOD OF ELECTRONIC ELEMENT

(75) Inventors: Yasuhiro Iguchi, Osaka (JP); Nobuyuki Mitsui, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 824 days.

(21) Appl. No.: 12/010,517

(22) Filed: Jan. 25, 2008

(65) Prior Publication Data

US 2008/0188078 A1 Aug. 7, 2008

(30) Foreign Application Priority Data

Feb. 1, 2007 (JP) .................................. 2007-022535

(51) Int. Cl.
*H01L 21/302* (2006.01)
*H01L 21/461* (2006.01)
(52) U.S. Cl. ......................... 438/689; 438/690; 216/52
(58) Field of Classification Search ................ 216/52; 438/689, 690
See application file for complete search history.

(56) References Cited

U.S. PATENT DOCUMENTS

| 5,212,394 A | 5/1993 | Iwasaki et al. |
| 6,294,019 B1 * | 9/2001 | Miura et al. ................ 117/96 |
| 6,841,848 B2 * | 1/2005 | MacNamara et al. ........ 257/618 |

FOREIGN PATENT DOCUMENTS

| JP | 03-171729 A | 7/1991 |
| JP | 09-181349 A | 7/1997 |
| JP | 2000-243942 A | 9/2000 |
| JP | 2002-050785 A | 2/2002 |
| JP | 2007-005658 A | 1/2007 |
| JP | 2007-150017 A | 6/2007 |

* cited by examiner

*Primary Examiner* — Roberts Culbert
(74) *Attorney, Agent, or Firm* — Venable LLP; Michael A. Sartori

(57) ABSTRACT

A circumferential portion of an epitaxial wafer is removed to remove an anomalously grown elevated portion formed in a circumferential chamfer. An epitaxial layer in the circumferential portion is removed with a width q=t to 5t wherein t is the thickness of the epitaxial layer so that the surface of a substrate is exposed. Therefore, cracking of the epitaxial layer in processing steps can be prevented.

5 Claims, 7 Drawing Sheets

PRIOR ART

MANUFACTURING METHOD OF ELECTRONIC ELEMENT

BACKGROUND OF THE INVENTION

1. Field of the Invention

The present invention relates to a technique for preventing cracking of a wafer in a wafer process for manufacturing semiconductor devices such as light-emitting elements and light-receiving elements.

2. Description of the Background Art

Processing of devices using InP and GaAs may cause cracking of an epitaxial wafer during the process. When a 2-inch or 3-inch wafer is processed, cracking of the wafer during the process makes it impossible to further continue the process and thus makes the wafer defective.

Although the process may be continued using a cracked wafer, transport and lithography become difficult because of the indeterminate form of pieces of the broken wafer. Therefore, it is necessary to find conditions suitable for the form and to manually process the pieces. Even when a device is manufactured on a piece of the broken wafer by various techniques in a time-consuming manner, much labor is required, thereby increasing the cost.

Herein, a light-receiving element is described. FIGS. 1A to 1F are longitudinal sectional views of one chip showing transitions in a process of manufacturing a pin-photodiode for fiber-optic communication. First, a S (sulfur)-doped InP substrate 2 having a diameter of 2 inches or 3 inches is prepared as a substrate. The sulfur-doped InP substrate 2 is an n-type.

As shown in FIG. 1A, a nondoped InP buffer layer 3 having a carrier concentration n of $1 \times 10^{15}$ cm$^{-3}$ and a thickness d of 2.0 μm, an InGaAs light absorption layer 4 having a carrier concentration n of $1 \times 10^{15}$ cm$^{-3}$ and a thickness d of 3.5 μm, and an InP window layer 5 having a carrier concentration n of $1 \times 10^{15}$ cm$^{-3}$ and a thickness d of 1.5 μm are epitaxially grown on the n-type InP substrate 2. The InGaAs light absorption layer 4 has a thickness of 3 to 4 μm so that light at 1.3 μm to 1.55 μm for fiber-optic communication can be sufficiently absorbed. In this case, d=3.5 μm. The wafer 2 serves as a substrate, and the InP buffer layer 3, the InGaAs light absorption layer 4, and the InP window layer 5 which are formed on the substrate are referred to as an "epitaxial layer 40". Such a wafer in which the epitaxial layer 40 is formed on a mirror wafer is referred to as an "epitaxial wafer 20".

Then, the steps of p-type dopant diffusion and electrode formation are performed. These steps are referred to as "processing steps". The processing steps include heating, cooling, film formation, etching, transport, and polishing steps. Therefore, external force such as heat strain and physical impact is applied to the epitaxial wafer. As a result, the wafer may be broken during processing. The processing steps applied to the epitaxial wafer are described with reference to FIGS. 1B to 1F.

First, a mask is formed for forming a p-type region. A SiN film 7 (or a SiON film) is deposited on the epitaxial wafer by a CVD method. The thickness of the SiN film 7 is 100 nm to 200 nm. The wafer is strongly heated in the CVD method. Next, the SiN film 7 is partially etched in a portion corresponding to the central portion of the element unit to form a mask opening. The circumferential portion remains covered with the SiN film 7. The epitaxial wafer 20 having the mask and Zn$_3$P$_2$ (zinc phosphide) used as a diffusion raw material are vacuum-encapsulated in a quartz ample. The ample is placed in an electric furnace and heated at 520° C. for 30 minutes to thermally diffuse Zn from the opening.

As shown in FIG. 1B, zinc (Zn) is thermally diffused to form a p-region 6 extending from the opening (central portion of the element) to the InP window layer 5 and the InGaAs light absorption layer 4. Consequently, a p-n junction is formed in the InGaAs light absorption layer 4. The ends of the p-n junction are protected by the SiN film 7.

Next, an antireflection film 8 is formed over the entire surface of the wafer. The antireflection film 8 is, for example, a SiON film. This film is also formed in about 100 nm to 200 nm thickness by the CVD. FIG. 1C is a sectional view showing an element unit provided with the antireflection film 8. A mask and resist are applied, and the antireflection film is removed from a portion corresponding to a portion of the p-region by lithography. Then, a AuZn film is deposited, and a AuZn electrode 9 can be formed using a liftoff technique. FIG. 1D is a sectional view showing the element after the formation of the p-electrode.

The InP substrate 2 is thinned by polishing the back of the substrate 2. For example, the InP substrate having an initial thickness of 350 μm is polished to about 200 μm. Thinning of the chip facilitates a process of dividing a wafer into individual chips. In the case of a laser diode, a substrate is polished to increase heat dissipation capacity. FIG. 1E shows the InP substrate which has been thinned by polishing until the shape can be physically maintained. Further, a AuGeNi film is formed on the back of the wafer and then partially removed to form an n-electrode 10. As a result, a light-receiving element as shown in FIG. 1F can be formed. When the n- and p-electrodes are reversely biased, light is incident from above, and reach the p-n junction through the p-region 6, a photocurrent occurs.

The epitaxial wafer has a diameter of 2 inches or 3 inches. A photodiode chip has a 300 μm to 500 μm-square shape. In a photodiode for detecting signals, the diameter of a light absorption portion is about 50 μm. In a monitor photodiode for monitoring laser output, the diameter of a light absorption portion is about 200 μm.

The zinc selective diffusion, antireflection film formation, p-type electrode formation, back polishing, and n-type electrode formation shown in FIGS. 1B to 1F may be referred to as a "wafer process" because they are performed directly in a wafer form. Herein, these are referred to as "processing steps". Although the epitaxial wafer is a complete circular wafer, the wafer may be broken during the processing steps. FIG. 2 shows an example of the epitaxial wafer 20 broken during the processing steps. The linear portion on the proximal side is an orientation flat 22. In this example, there a longitudinal linear crack 23 and a transverse crack 24. The broken wafer is separated into three pieces 28, 29, and 30.

In both transport and mask alignment, the same processing steps as those for the whole wafer cannot be used for the pieces. When the processing steps are performed for each of the pieces, a manual labor is required. FIG. 3 also shows an example of a broken wafer. In this example, oblique cracks 25, 26, and 27 occur. The wafer is broken into indeterminate-form pieces 32, 33, and 34. It is difficult to perform the processing steps for such indeterminate form pieces even by a manual labor. Although, in each of the above-described examples, the wafer is broken into three pieces, the wafer may be broken into two or four pieces.

When photodiodes are manufactured using a 2-inch InP epitaxial wafer as a substrate, the processing steps cause cracking at a probability of as high as 30% or more. A 3-inch InP epitaxial wafer is broken at a probability of about 40% or more. Processing a broken wafer by a manual labor increases the cost. However, when the broken wafer is disposed of, the yield in a wafer stage is lowered, thereby increasing the cost as a whole.

Patent Document 1 U.S. Pat. No. 5,212,394

Patent Document 1 relates to a problem in which in a compound semiconductor heteroepitaxial wafer, i.e., a GaAs or InP heteroepitaxial wafer, dislocations extend from the end toward a center or cracks occur at the end. This document describes that unlike a Si wafer, a compound semiconductor wafer is not technically matured yet and thus has many problems of dislocation and breakage. In heteroepitaxial growth, there are many dislocations and other defects in a circumferential portion while no dislocation is present in a central portion. The document also describes that dislocations and defects propagate toward a central portion due to heating and impact in the wafer process, thereby degrading the quality of an epitaxial layer in the central portion.

Therefore, as shown in FIG. 5 of Patent Document 1, an annular groove 35 is provided in a circumferential portion of an epitaxially grown epitaxial wafer 20 in order to separate an epitaxial layer 37 in the circumferential portion from an epitaxial layer 36 in the central portion. Dislocations 38 present at a high density in the circumferential portion are cut off by the annular groove 35. The dislocations 38 do not enter the central portion 36. Patent Document 1 describes that the epitaxial layer in the central portion is protected during the wafer process. This means that diffusion of the high-density dislocations in the circumferential epitaxial layer into the central epitaxial layer is cut off by the annular groove. Unlike in Patent Document 1 in which a problem is to prevent propagation of dislocations, in the present invention, cracking of a wafer is considered as a more important problem. However, since the present invention is slightly similar to Patent Document 1 in that an annular groove is formed, Patent Document 1 is described herein.

When an epitaxial layer is provided on a compound semiconductor wafer such as an InP substrate or a GaAs substrate and then subjected to processing steps, the wafer is broken at a probability of as high as 30% to 40% as shown in FIG. 2 or 3. The arcuate pieces 30, 28, and 29 having a relatively regular shape can be continuously subjected to subsequent processing steps (p-n junction formation, antireflection film formation, formation of p- and n-electrodes, etc.) by a manual labor. However, the wafer to be handled is not a standard circular wafer, a manual labor is required, and efficiency is decreased to increase the required time. As a result, the workload is increased to increase the cost.

The indeterminate form pieces 32, 33, and 34 are difficult to process even by a manual labor. Consequently, the pieces 32, 33, and 34 are disposed of. Therefore, when an epitaxial wafer is broken, the efficiency of processing steps is decreased to increase the cost. In addition, the waste amount is undesirably increased.

SUMMARY OF THE INVENTION

An object of the present invention is to provide a technique for preventing breakage of a compound semiconductor epitaxial wafer during processing steps.

A circumferential portion of an epitaxial wafer in which a compound semiconductor thin film is epitaxially grown on a compound semiconductor is removed by etching. As a result, an anomalously grown elevated portion in the circumferential portion is removed. The width q of a portion to be removed by etching is q=t to 5t wherein t is the thickness of the wafer. When the width q of the circumferential removal is larger than 5t, the ratio of wastes in the wafer is excessively increased. When q is smaller than t, cracking cannot be prevented.

When the wafer thickness t=300 μm, q=about 0.3 mm to 1.5 mm, when the wafer thickness t=350 μm, q=about 0.35 mm to 1.75 mm, and when the wafer thickness t=500 μm, q=about 0.5 mm to 2.5 mm. Although the optimum width q changes according to the wafer thickness, the width may be about 1 mm in many cases. With respect to the etching depth, the circumferential portion is removed until an InP substrate is exposed or to a depth in the range of 0 μm to 10 μm from the surface of the InP substrate (0 μm<s≦10 μm wherein s is the removal amount of the circumferential portion of the substrate). By removing an epitaxial layer in the circumferential portion, cracking of the wafer in the processing steps can be significantly decreased.

The probability of cracking of the wafer in the processing steps was significantly decreased by removing the epitaxial layer. In a 2-inch InP epitaxial wafer provided with a circumferential removal of 1 mm in width, the probability of cracking in the processing steps was decreased to about 5%. Namely, the probability of cracking is decreased to about ⅙ because cracking occurs at a probability of 30% when there is no circumferential removal.

The reason why it is effective to remove an epitaxial layer in the circumferential portion is described below. As shown in FIG. 4, it was found that the epitaxial layer is anomalously elevated in the circumferential portion of an InP substrate 2. Consideration is given to the reason why an anomalously elevated portion 42 is formed. The circumferential portion of the wafer is chamfered 39. Chamfering is also referred to as "beveling". Chamfering is performed by cutting the circumferential portion of the wafer with a grind stone to remove the corner and to prevent defects and cracks at the edge of the wafer. The amount of chamfering changes according to the material used, dimensions, and purpose. In a 2 to 3-inch InP substrate, the circumferential portion is cut by about 400 μm to 500 μm in width.

Even when the top surface of an InP substrate is a low index plane, a chamfer contains planes with various indexes. For example, in an InP substrate having a (100) plane as the top surface, the circumferential chamfer has various index planes because it is obliquely cut. A high-index plane also appears. Therefore, epitaxial growth on the circumferential portion causes anomalous growth on the chamfer. In FIG. 4, even when the thickness of an epitaxial layer 40 is 7 μm (InP buffer 2.0 μm, InGaAs 3.5 μm, InP window layer 1.5 μm), anomalous elevation of 10 μm to 20 μm occurs on the chamfered portion 39. As a result, the thickness is locally increased.

In addition, the chamfer includes crystal grains having crystal planes other than a (100) crystal orientation plane as a top surface. Namely, the crystal orientation may be deviated. Further, in growth of InGaAs, the ratio of mixed crystal is deviated from a fixed value. A thin film grown on the chamfer has an excessive thickness, deviation in crystal orientation, deviation in the composition, and the like and thus causes strain. Anomalous growth on the chamfer exerts strong stress on the central portion of the wafer. In strong heating, strong thermal stress occurs due to a difference in thermal conductivity and a difference in ratio of thermal expansion of the elevated portion 42 of the circumferential portion. In polishing, the back of the substrate is pressed on a turn table with the epitaxial layer side being in contact with a polishing plate, and the polishing plate is rotated while being pressed. Therefore, the elevated portion 42 of the surface of the wafer locally contacts the polishing plate, and cracking is induced in the wafer due to a difference in height.

The size of the anomalously grown portion on the chamfer depends on the chamfering width. As described above, the 2-inch InP substrate of 350 μm in thickness has a chamfering depth of 10 μm to 20 μm and a chamfering width of 400 μm to 500 μm. The ranges of proper values of the chamfering depth and width depend on the thickness t and diameter D of the InP substrate. The size and height of the anomalously grown portion 42 vary according to the chamfer dimensions. Even when the anomalously grown portion is small, a slight flaw is produced by pressure, heating, or impact because of differences in composition, thermal conductivity, thermal capacity, and height, thereby starting cracking of the wafer. When extension of a flaw proceeds along cleavage, linear cracks occur as shown in FIG. 2.

In the case of nonuniform heating and pressure, zigzag oblique cracks occur as shown in FIG. 3. It was found that in any of the cases, cracking originates from the anomalously grown elevated portion 42 of the epitaxial layer in the circumferential portion, and this triggers overall cracking. Although the epitaxial layer 40 in the central portion of the wafer is composed of a single crystal with the same (100) plane as the substrate, the portion 42 on the chamfer has a deviation in the composition, a deviation in the orientation, and collection of polycrystal grains. This causes cracking by the action of a high temperature, high pressure, and high frictional force in the processing steps. Since cracking rapidly spreads from the origin, cracking occurs over the entire wafer. The inventors have found the above-mentioned facts.

Therefore, the inventors have found that it is effective to remove the epitaxially grown anomalous portion 42 in the circumferential portion. In fact, the removal of the epitaxial layer in the circumferential portion of an epitaxial wafer caused the excellent effect that the wafer was little cracked in the wafer process.

Since the anomalously elevated portion in the circumferential portion is removed, stress or thermal stress is not produced from the circumferential portion even when a thermal or physical factor such as heating or impact is applied to the wafer. As a result, the wafer is not broken. The present invention is not limited to the manufacture of a light-receiving element on an InP substrate. The present invention can also be used for preventing cracking of a wafer in the process when a light-emitting element such as a laser diode or a light-emitting diode is manufactured on an InP substrate or a GaAs substrate. Further, when not only the epitaxial layer is removed but also the circumferential portion of the substrate is removed to a depth of 0 μm to 10 μm, wafer cracking can be further avoided. In an anomalously epitaxially grown portion, cracking may be caused due to damage to the surface layer of the substrate. In view of removal of a damaged layer, it is meaningless to remove to a depth of more than 10 μm, and the process yield is rather decreased. (In wet etching, etching proceeds in a transverse direction due to side etching, and thus side etching is increased by excessively deep etching, resulting in excessive removal. In dry etching such as RIE, a resist is etched by RIE, and thus a thick resist mask is required for deep etching but has technical difficulty.)

As in Patent Document 1 (FIG. 5), when the annular groove is formed, an anomalously grown elevated portion remains in the circumferential portion 37 of the epitaxial layer. An impact due to the anomalously grown elevated portion and nonuniform heating cause cracking, and the annular groove additionally increases nonuniformity in strength, thereby further accelerating the occurrence of cracking. The object of the present invention is completely different from that of Patent Document 1, and the technique and results are also different from Patent Document 1.

DETAILED DESCRIPTION OF THE INVENTION

First Embodiment

The gist of the present invention is to remove a circumferential portion of an epitaxial wafer including compound semiconductor thin films epitaxially grown on an InP or GaAs substrate. As a result, an anomalously grown portion which is an elevated portion in the circumferential portion can be completely removed, and thus the wafer is little broken in subsequent processing steps (wafer process).

In order to selectively remove only the circumferential portions of the epitaxial layers, the entire surface of the epitaxial wafer is masked and covered with a resist, and a mask is formed by development so as to cover a central portion excluding only the circumferential portion of the resist. Then, the epitaxial layers are removed using a liquid etchant or RIE. The epitaxial layers are composed of InP and InGaAs, and thus when the etchant is used, it is necessary to change the etchant because suitable etchants for the respective epitaxial layers are different. Namely, HCl is used for etching the InP layer, and $H_3PO_4$ is used for etching the InGaAs layer. Since each of the layers has a thickness of as small as about 1 μm to 4 μm, each of the layers can be removed by etching for about 1 minute to 3 minutes.

Figure 1A:
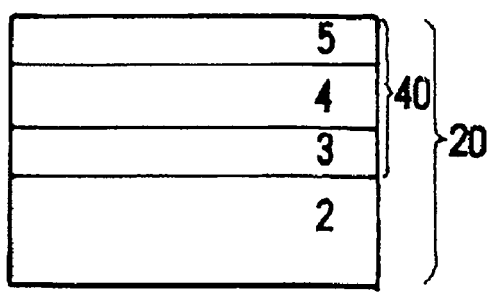
FIG. 1A is a sectional view of a unit of an initial epitaxial waver, for illustrating processing steps performed on the epitaxial wafer in order to manufacture a photodiode, the epitaxial wafer in which an InP buffer layer, an InGaAs light absorption layer, and an InP window layer are formed on an InP substrate in this order.
Figure 1B:
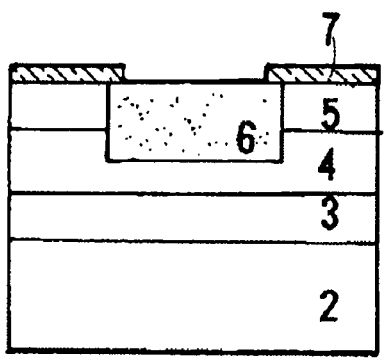
FIG. 1B is a sectional view of the epitaxial wafer in which zinc is diffused from a mask opening using a SiN mask to form a p-region up to an intermediate depth of the InGaAs light absorption layer.
Figure 1C:
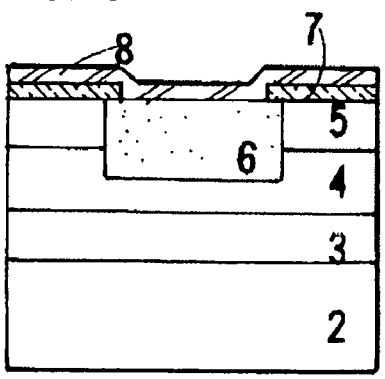
FIG. 1C is a sectional view of the epitaxial wafer in which the entire region of the top surface is coated with an antireflection film.
Figure 1D:
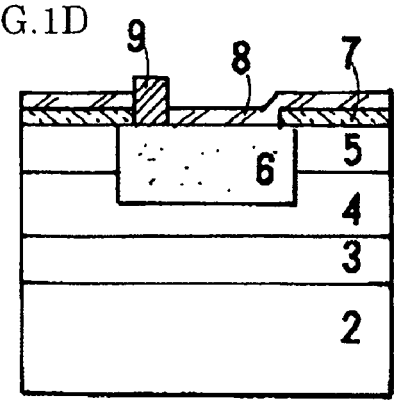
FIG. 1D is a sectional view of the epitaxial wafer in which a hole is formed in the antireflection film, and a p-electrode is formed to reach a portion of the p-region.
Figure 1E:
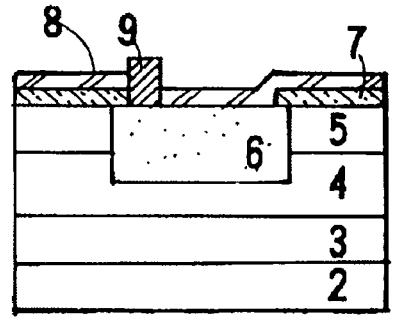
FIG. 1E is a sectional view of the epitaxial wafer in which the InP substrate is thinned by polishing the back side thereof.
Figure 1F:
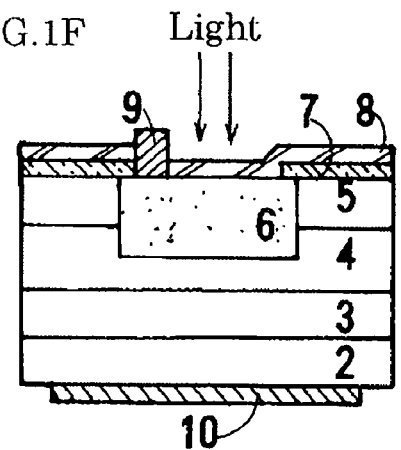
FIG. 1F is a sectional view of the epitaxial wafer in which a n-electrode is formed on the lower surface of the substrate.
Figure 2:
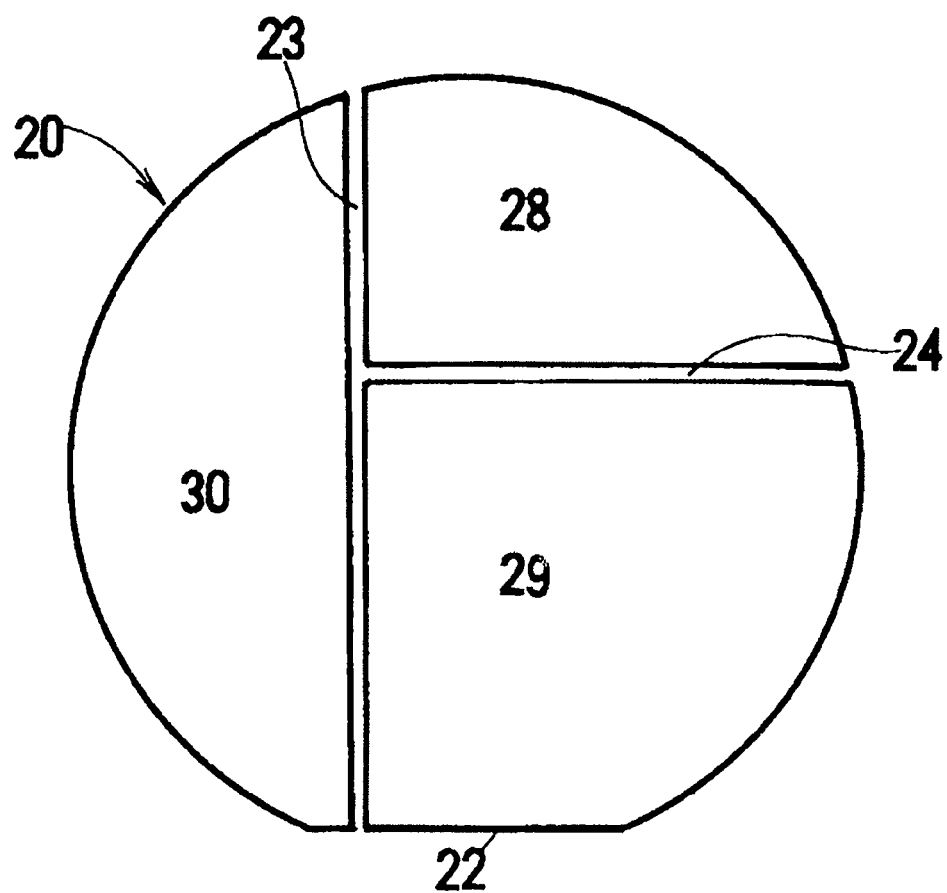
FIG. 2 is a plan view showing an example of an epitaxial wafer broken in processing steps.
Figure 3:
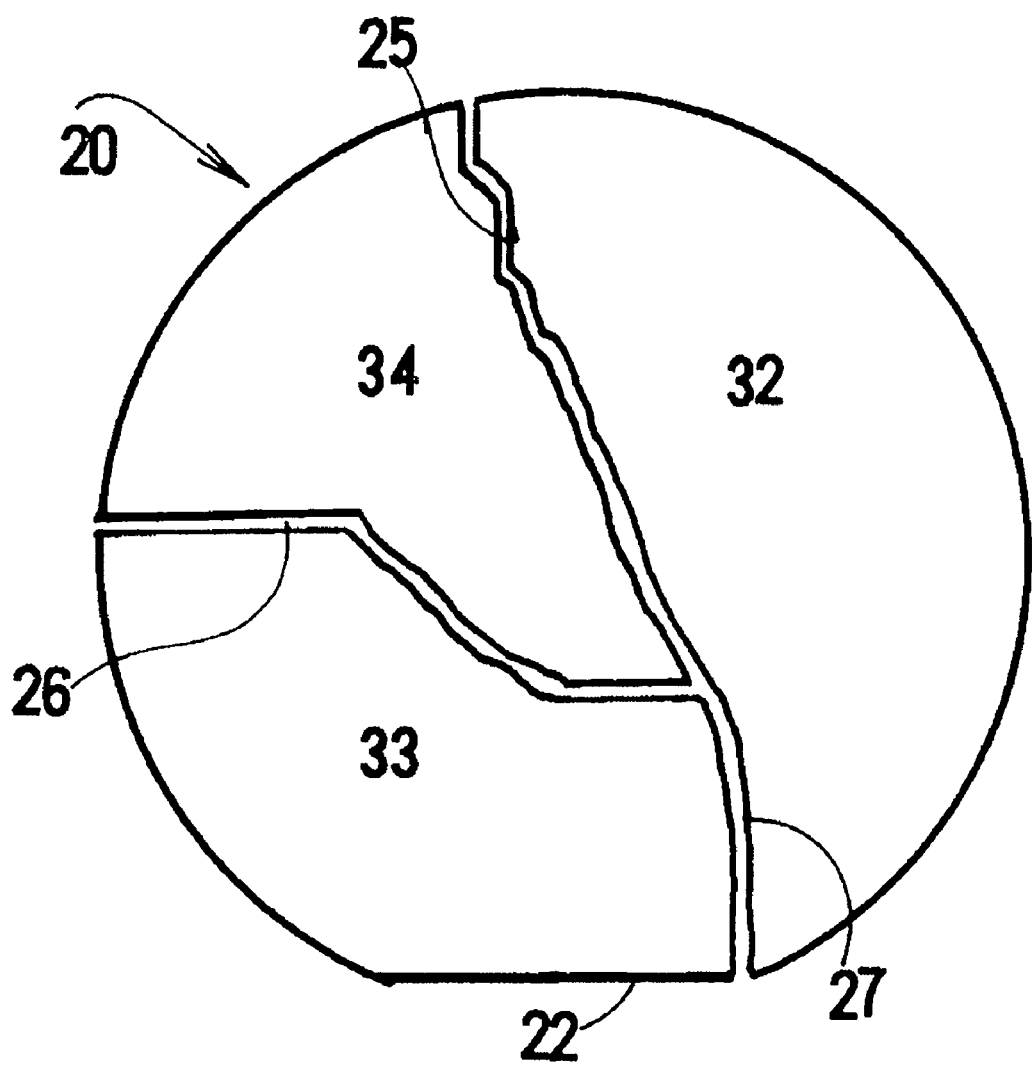
FIG. 3 is a plan view showing another example of an epitaxial wafer broken in processing steps.
Figure 4:
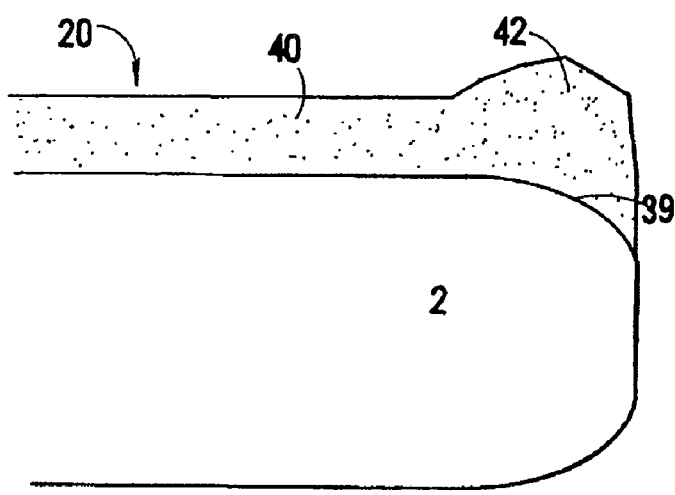
FIG. 4 is a longitudinal partial sectional view illustrating the fact that an anomalously grown thick portion is formed in an epitaxial layer in a circumferential portion of a wafer.
Figure 5:
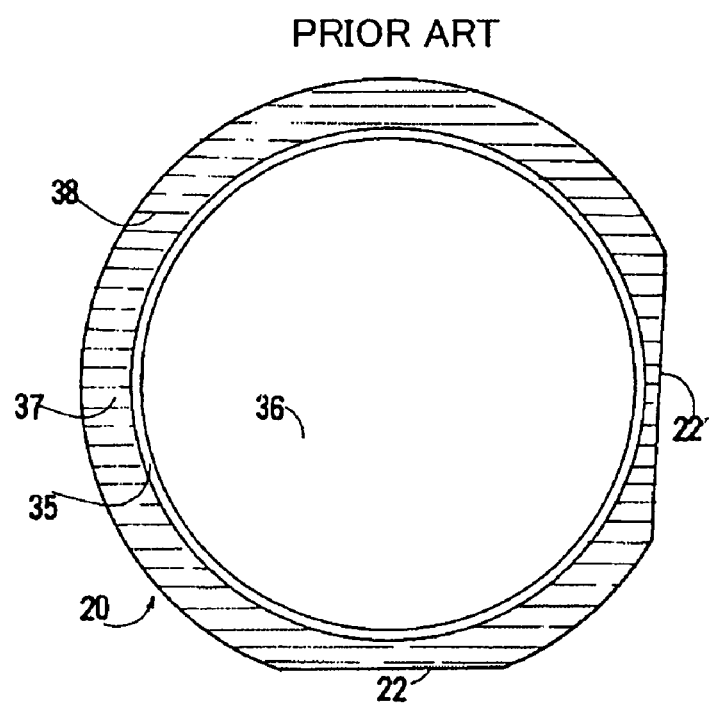
FIG. 5 is a plan view of a compound semiconductor wafer having an annular groove proposed in US5,212,394.

The process of the present invention starting from the epitaxial wafer includes wafer washing, formation of a diffusion mask SiN layer, resist coating, formation of a pattern for etching, wet etching, resist removal, diffusion pattern formation, diffusion, etc. Thereafter, a processing step such as usual Zn diffusion (FIG. 1B) is performed. The steps added for the present invention are only four steps, i.e., resist coating, formation of an etching pattern, wet etching, and resist removal.

Figure 8:
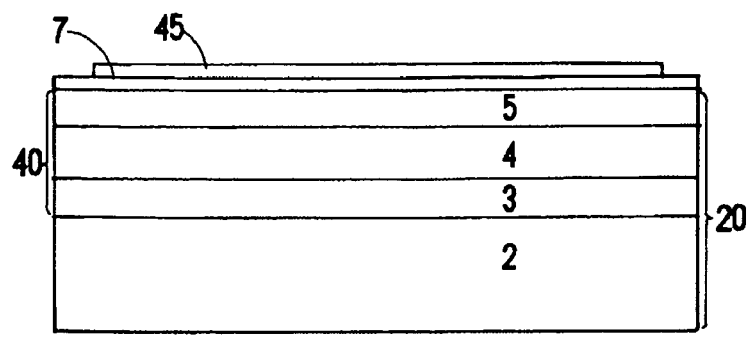
FIG. 8 is a longitudinal sectional view of an epitaxial wafer in which a mask is formed on an epitaxial wafer/SiN film so as to cover a central portion thereof in order to annularly remove an epitaxial layer from a circumferential portion.

FIG. 8 is a drawing for illustrating the steps of the present invention. This figure is a sectional view of the whole epitaxial wafer. FIGS. 1A to 1F are sectional views of a portion corresponding to one element. Don't confuse FIGS. 1A to 1F with FIG. 8. A wafer has a diameter of 2 inches (5 cm) or 3 inches (7.5 cm). A chip has a side length of 0.3 to 0.5 mm. For example, about 5,000 to 20,000 chips of light receiving elements can be obtained from a 2-inch wafer.

FIG. 8 shows a state in which an InP buffer layer 3, an InGaAs light absorption layer 4, and an InP window layer 5 are epitaxially grown on an InP substrate 2 (whole wafer) of an epitaxial wafer 20, and a SiN layer 7 and a resist layer 45 are formed on the epitaxial wafer 20. The attributes of the layers below the SiN layer 7 are described in order from above.

SiN layer 7 d=200 nm
InP window layer 5 n=1×10$^{15}$ cm$^{-3}$, d=1.5 μm
InGaAs light absorption layer 4 n=1×10$^{15}$ cm$^{-3}$, d=3.5 μm
InP buffer layer 3 n=1×10$^{15}$ cm$^{-3}$, d=2.0 μm
InP substrate (wafer) 2 d=350 μm In the resist film, the circumferential portion has been removed by 1 mm. This corresponds to the above-described step of forming an etching pattern.

Figure 9:
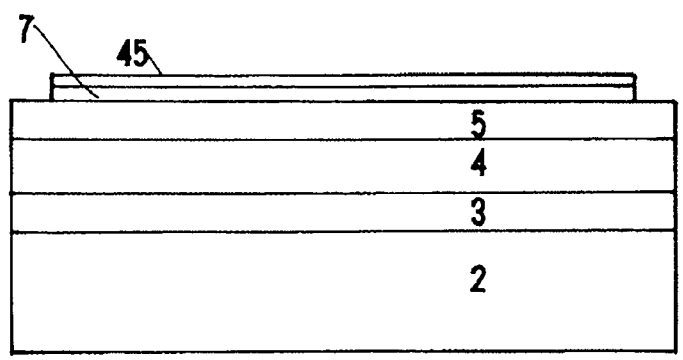
FIG. 9 is a longitudinal sectional view of an epitaxial wafer in which a mask is formed on an epitaxial wafer/SiN film so as to cover a central portion thereof in order to remove an epitaxial layer from a circumferential portion, and a circumferential portion of the SiN film is removed by etching.
Figure 10:
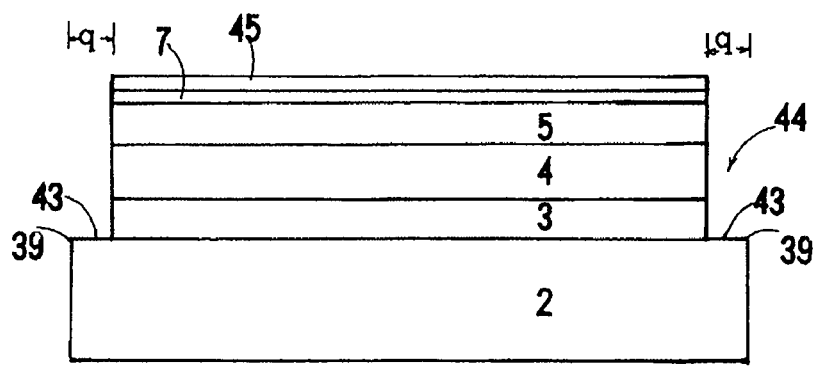
FIG. 10 is a longitudinal sectional view of an epitaxial wafer in which a mask is formed on an epitaxial wafer/SiN film so as to cover a central portion thereof, and circumferential portions of the SiN film, an InP window layer, an InGaAs light absorption layer, and an InP buffer layer are longitudinally removed by etching according to the present invention.
Figure 11:
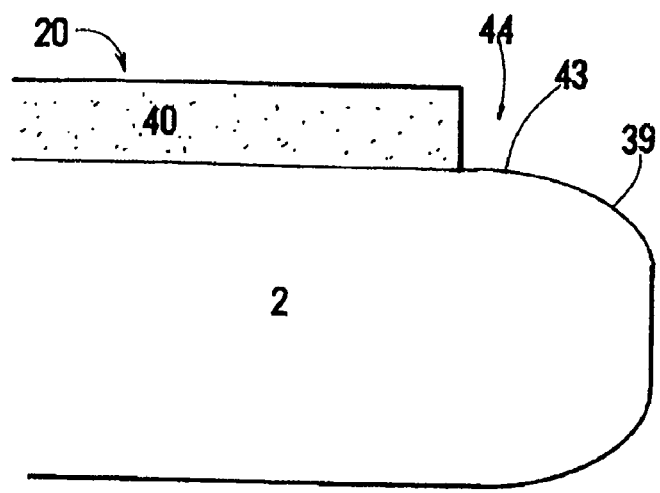
FIG. 11 is a longitudinal sectional view of a circumferential portion of an epitaxial wafer in which a circumferential portion of an epitaxial layer is removed by etching according to the present invention.
Figure 12:
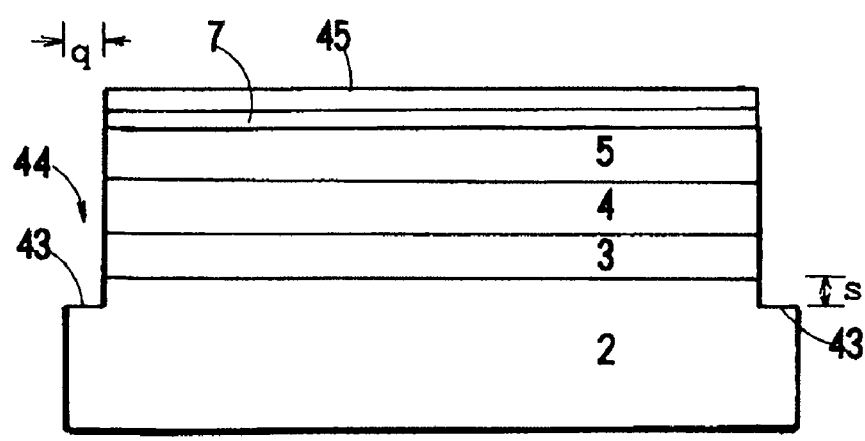
FIG. 12 is a longitudinal sectional view of an epitaxial wafer in which not only a circumferential portion of epitaxial layers but also a portion of the substrate continued from the epitaxial layers is removed according to the present invention.

Then, wet etching is performed. FIG. 9 shows a state in which the SiN layer 7 is removed by wet etching. Then, the circumferential portion of the InP window layer 5, which is not protected by the mask, is dissolved in hydrochloric acid HCl. Then, the exposed circumferential portion of the InGaAs light absorption layer 4 is removed by dissolution in phosphoric acid $H_3PO_4$. Then, the exposed circumferential portion of the InP buffer layer 3 is removed by dissolution in hydrochloric acid HCl. Hydrochloric acid can dissolve the InP substrate 2. Not only the epitaxial layers but also a portion of the substrate continued from the epitaxial layers may be dissolved. FIG. 12 is a sectional view showing a wafer in which a substrate is partially removed. The removal amount of the substrate is in the range of 0 μm<s≦10 μm. Since a surface layer of the substrate in which the crystal is weakened by stress is removed, the wafer is less broken.

Figure 6:
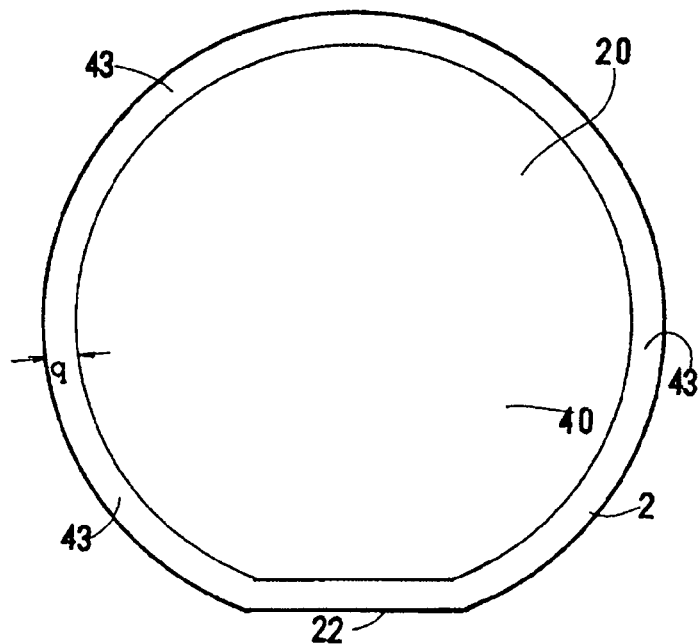
FIG. 6 is a plan view of an epitaxial wafer in which an epitaxial layer is annularly removed from a circumferential portion according to the present invention.
Figure 7:
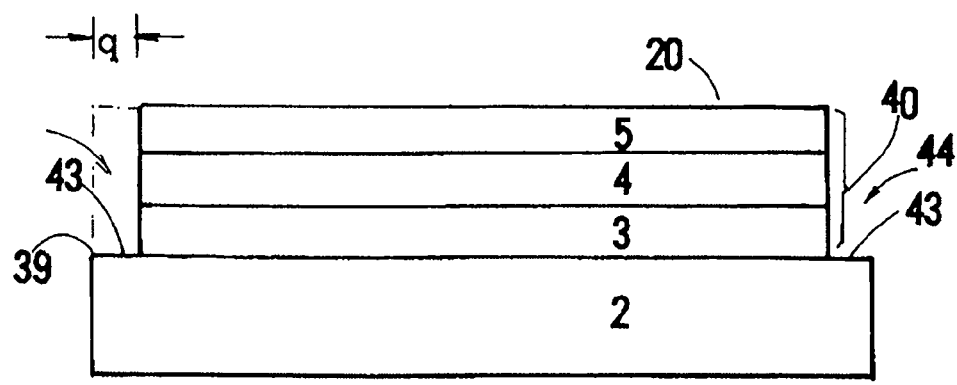
FIG. 7 is a longitudinal sectional view of an epitaxial wafer in which an epitaxial layer is annularly removed from a circumferential portion according to the present invention.

The epitaxial layer 44 is removed so as to remove the substrate, and thus a circumferential substrate exposed portion 43 is left in the circumferential portion. The edge of the exposed portion 43 is a chamfer 39. In the chamfer 39, an anomalously grown portion due to epitaxial growth is not present. The epitaxial layer 4 in the circumferential portion has a circumferential removal 44, and, as shown in a plan view of FIG. 6 and a sectional view of FIG. 7, the whole wafer has a stepped shape in which the height of circumferential portion is about 7 μm to 20 μm lower.

Each of the three layers in the circumferential portion can be removed for about 1 to 3 minutes, depending on the temperature and the etching solution concentration. The steps added for removing the circumferential portions of the epitaxial layers are only four steps, i.e., resist coating, formation of an etching pattern, wet etching, and resist removal. Therefore, the treatment time required for all steps is increased by only about 30 minutes.

When the epitaxial wafer provided with the epitaxial layers having the circumferential removed portion 44 is subjected to subsequent processing steps such as diffusion, p-electrode formation, back polishing, and n-electrode formation, the wafer is little broken. The probability of cracking can be suppressed to 5% or less.

What is claimed is:
1. A manufacturing method of a semiconductor element comprising:
providing an InP substrate or a GaAs substrate, wherein the substrate includes a circumferential portion having a chamfered part and a straight part along a thickness direction;
epitaxially growing an epitaxial layer at least on the chamfered part of the circumferential portion of the substrate, but not on the straight part, to form an epitaxial wafer; and
removing only the epitaxial layer with a width of 0.3 mm to 3 mm from the circumferential portion of the substrate using a liquid etchant or RIE, while retaining the cir- cumferential portion of the substrate, before a processing step for manufacturing a device on the epitaxial wafer.

2. A manufacturing method of a semiconductor element comprising:

providing an InP substrate or a GaAs substrate, wherein the substrate includes a circumferential portion having a chamfered part and a straight part along a thickness direction;

epitaxially growing an epitaxial layer at least on the chamfered part of the circumferential portion of the substrate, but not on the straight part, to form an epitaxial wafer; and removing only the epitaxial layer with a width of t to 5t from the circumferential portion of the substrate having a thickness t using a liquid etchant or RIE, while retaining the circumferential portion of the substrate, before a processing step for manufacturing a device on the epitaxial wafer.

3. The manufacturing method according to claim 2, wherein the epitaxial wafer has an epitaxial layer in which at least InGaAs is formed on the InP substrate, and the thickness of InGaAs is 1 μm or more.

4. The manufacturing method according to claim 3, wherein the epitaxial wafer is further provided with an InP cap layer formed on the InGaAs layer.

5. A manufacturing method of a semiconductor element comprising:

providing an InP substrate or a GaAs substrate, wherein the substrate includes a circumferential portion having a chamfered part and a straight part along a thickness direction;

epitaxially growing an epitaxial layer on the substrate, but not on the straight part of the circumferential portion of the substrate, to form an epitaxial wafer; and removing only the epitaxial layer with a width of t to 5t from the circumferential portion of the substrate having a thickness t using a liquid etchant or RIE, while retaining the circumferential portion of the substrate, before a processing step for manufacturing a device on the epitaxial wafer.

* * * * *